US011799303B2

(12) United States Patent
Han et al.

(10) Patent No.: US 11,799,303 B2
(45) Date of Patent: Oct. 24, 2023

(54) BATTERY PROTECTION CIRCUIT AND BATTERY PACK COMPRISING SAME

(71) Applicant: SAMSUNG SDI CO., LTD., Yongin-si (KR)

(72) Inventors: Jong-Chan Han, Yongin-si (KR); Woojin Lee, Yongin-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 129 days.

(21) Appl. No.: 16/637,347

(22) PCT Filed: Mar. 9, 2018

(86) PCT No.: PCT/KR2018/002841
§ 371 (c)(1),
(2) Date: Feb. 7, 2020

(87) PCT Pub. No.: WO2019/035523
PCT Pub. Date: Feb. 21, 2019

(65) Prior Publication Data
US 2021/0367440 A1    Nov. 25, 2021

(30) Foreign Application Priority Data

Aug. 14, 2017    (KR) .................. 10-2017-0103136
Nov. 23, 2017    (KR) .................. 10-2017-0157636

(51) Int. Cl.
*H02J 7/00*       (2006.01)
*G01R 31/382*     (2019.01)
(Continued)

(52) U.S. Cl.
CPC ........ *H02J 7/00308* (2020.01); *G01R 31/382* (2019.01); *H01M 10/482* (2013.01);
(Continued)

(58) Field of Classification Search
USPC ....................................................... 320/134
See application file for complete search history.

(56) References Cited

U.S. PATENT DOCUMENTS 5,705,911 A    1/1998    Tamai
6,208,117 B1   3/2001    Hibi
(Continued)

FOREIGN PATENT DOCUMENTS

CN    101123364 A    2/2008
CN    101312260 A    11/2008
(Continued)

OTHER PUBLICATIONS

International Search Report dated Jun. 29, 2018 for PCT/KR2018/002841.
(Continued)

*Primary Examiner* — Samuel Berhanu
(74) *Attorney, Agent, or Firm* — Lee IP Law, P.C.

(57) ABSTRACT

A battery protection circuit includes: a charging control switch connected in series to a big current path between a battery module configured with a plurality of cells connected in series and a plurality of pack terminals; a battery controller for controlling the charging control switch based on cell voltages of the cells; and a plurality of first protection circuits connected to the respective cells on the big current path, and intercepting or allowing a current flowing to the corresponding cell based on the cell voltage of the corresponding cell from among the cells, wherein the first protection circuits respectively include at least one switch connected in series between neighboring cells or between one of the cells and a first pack terminal from among the pack terminals, and a cell controller for controlling the at least one switch according to a cell voltage of the corresponding cell.

16 Claims, 3 Drawing Sheets

(51) Int. Cl.
*H01M 50/583* (2021.01)
*H01M 10/48* (2006.01)
*H01M 50/204* (2021.01)

(52) U.S. Cl.
CPC ....... *H01M 50/204* (2021.01); *H01M 50/583* (2021.01); *H02J 7/0024* (2013.01); *H02J 7/0047* (2013.01); *H01M 2200/103* (2013.01); *H02J 2207/10* (2020.01)

(56) References Cited

U.S. PATENT DOCUMENTS

| | | | |
|---|---|---|---|
| 8,953,293 B2* | 2/2015 | Ji | H01M 10/42 |
| | | | 361/91.1 |
| 10,389,144 B2* | 8/2019 | Jin | H02J 7/0031 |
| 2005/0077878 A1 | 4/2005 | Carrier et al. | |
| 2008/0116851 A1 | 5/2008 | Mori | |
| 2008/0290835 A1 | 11/2008 | Hayashi | |
| 2011/0156654 A1 | 6/2011 | Kim et al. | |
| 2013/0163134 A1 | 6/2013 | Ji | |
| 2014/0042972 A1 | 2/2014 | Kim et al. | |
| 2014/0062387 A1 | 3/2014 | Kim | |
| 2014/0103876 A1* | 4/2014 | Kim | H02J 7/007 |
| | | | 320/112 |
| 2015/0200537 A1 | 7/2015 | Kang et al. | |
| 2018/0226816 A1 | 8/2018 | Na et al. | |

FOREIGN PATENT DOCUMENTS

| | | |
|---|---|---|
| CN | 102110976 A | 6/2011 |
| CN | 101916887 B | 3/2013 |
| CN | 103187715 A | 7/2013 |
| CN | 103595082 A | 2/2014 |
| CN | 103683370 A | 3/2014 |
| DE | 102013204524 A1 | 9/2014 |
| JP | 09-163612 A | 6/1997 |
| JP | 2014-121119 A | 6/2014 |
| KR | 10-2008-0082869 A | 8/2008 |
| KR | 10-2009-0014897 A | 2/2009 |
| KR | 10-1054888 B1 | 8/2011 |
| KR | 10-1201139 B1 | 11/2012 |
| KR | 10-2013-0075640 A | 7/2013 |
| KR | 10-2014-0048737 A | 4/2014 |
| KR | 10-2017-0053886 A | 5/2017 |
| TW | 490871 B | 6/2002 |
| TW | 201213178 A1 | 4/2012 |
| TW | 201547146 A | 12/2015 |
| WO | WO 2007/145307 A1 | 12/2007 |
| WO | WO 2017-030321 A1 | 2/2017 |

OTHER PUBLICATIONS

European Office action dated Feb. 9, 2021.
Chinese Office action and Search Report dated Jan. 6, 2023.
Korean Office action dated Aug. 24, 2022.
Notice of Allowance dated Jun. 19, 2023, including a Search Report dated Jun. 14, 2023, of the corresponding Chinese Patent Application No. 201880052904.5.

* cited by examiner

BATTERY PROTECTION CIRCUIT AND BATTERY PACK COMPRISING SAME

CROSS REFERENCE TO RELATED APPLICATIONS

This is the U.S. national phase application based on PCT Application No. PCT/KR2018/002841, filed Mar. 9, 2018, which is based on Korean Patent Application No. 10-2017-0103136, filed Aug. 14, 2017, and Korean Patent Application No. 10-2017-0157636, filed Nov. 23, 2017, the entire contents of all of which are hereby incorporated by reference.

TECHNICAL FIELD

An exemplary embodiment relates to a battery protection circuit and a battery pack including the same.

BACKGROUND ART

A secondary cell represents a cell for alternately repeating charging and discharging. The secondary cell may change chemical energy into electrical energy and may then be discharged, and when it is charged with electrical energy while it is discharged, it may store the same in a chemical energy form again.

The secondary cell is applied to various portable electronic devices. For example, a multi-serial structured battery pack configured by a combination of a plurality of secondary cells (referred to as cells hereinafter) coupled in series to each other and a charging and discharging circuit is mounted to a laptop computer.

A thermal cut-off (TCO) may be mounted to a multi-serial structured battery pack configured by a connection of square-shaped cells or polymer cells in series. The TCO represents an element for intercepting a current according to a temperature and securing safety of the cells from the dangers such as overcharging or short-circuits.

The TCO is operable by the temperature, so it has to be closely attached to the cell so that the temperature may be easily transmitted from the cell. Because of such a characteristic, an additional subsidiary material such as a tape or a Ni plate may be used or an additional process such as welding, attaching a cell, or taping may be required so as to mount the TCO on the battery pack. Further, when the TCO is mounted thereon in a wrong way and the temperature is not sufficiently transmitted from the cell, a protection operation by the TCO may not properly work.

DISCLOSURE

Technical Problem

The present invention has been made in an effort to provide a battery protection circuit for supporting a protection operation for each cell in a multi-serial structured battery pack and a battery pack including the same.

Technical Solution

An exemplary embodiment of the present invention provides a battery protection circuit including: a charging control switch connected in series to a big current path between a battery module configured with a plurality of cells connected in series and a plurality of pack terminals; a battery controller for controlling the charging control switch based on cell voltages of the cells; and a plurality of first protection circuits connected to the respective cells on the big current path, and intercepting or allowing a current flowing to the corresponding cell based on the cell voltage of the corresponding cell from among the cells, wherein the first protection circuits may respectively include at least one switch connected in series between neighboring cells or between one of the cells and a first pack terminal from among the pack terminals, and a cell controller for controlling the at least one switch according to a cell voltage of the corresponding cell.

The battery protection circuit may further include: a fuse element connected in series to the big current path; and a second protection circuit for controlling the fuse element based on the cell voltages of the cells.

The fuse element may include: a control terminal; at least one heating resistor connected to the control terminal and generating heat according to a voltage applied to the control terminal; and a fuse connected in series to the big current path and short-circuited by the generation of heat by the heating resistor.

The first and second protection circuits may be independently driven.

The at least one switch may be a field-effect transistor.

The at least one switch may include a drain terminal, a source terminal connected to a first electrode of the corresponding cell, and a gate terminal for receiving a control signal from the cell controller, and includes a first N-channel field-effect transistor for controlling a current flowing in a first direction to the corresponding cell.

The at least one switch may include a drain terminal connected to a drain terminal of the first N-channel field-effect transistor, a source terminal connected to a cell neighboring the corresponding cell or the first pack terminal, and a gate terminal for receiving a control signal from the cell controller, and further includes a second N-channel field-effect transistor for controlling a current flowing in a second direction to the corresponding cell.

The first protection circuits may respectively include: a first resistor connected to a second electrode of the corresponding cell, and transmitting a voltage at a second electrode of the corresponding cell to the cell controller; a capacitor connected between the first resistor and a first electrode of the corresponding cell; and a second resistor connected to a source terminal of the second N-channel field-effect transistor, and operable as a current limiting resistor with the first resistor.

The first electrode of the corresponding cell may be a negative electrode of the corresponding cell.

Another embodiment of the present invention provides a battery pack including: a battery module including a plurality of cells connected in series; a plurality of pack terminals; a charging control switch connected in series to a big current path between the battery module and the pack terminals; a battery controller for controlling the charging control switch based on cell voltages of the cells; and a plurality of first protection circuits connected to the cells on the big current path, and intercepting or allowing a current flowing to the corresponding cell based on a cell voltage of the corresponding cell from among the cells, wherein the first protection circuits may respectively include at least one switch connected in series between cells neighboring each other or between one of the cells and a first pack terminal from among the pack terminals, and a cell controller for controlling the at least one switch according to a cell voltage of the corresponding cell.

The battery pack may further include: a fuse element connected in series to the big current path; and a second protection circuit for controlling the fuse element based on cell voltages of the cells.

The at least one switch of the battery pack may include: a first N-channel field-effect transistor including a drain terminal, a source terminal connected to a first electrode of the corresponding cell, and a gate terminal for receiving a control signal from the cell controller, and controlling a current flowing in a first direction to the corresponding cell; and a second N-channel field-effect transistor including a drain terminal connected to the drain terminal of the first channel field-effect transistor, a source terminal connected to a cell neighboring the corresponding cell or the first pack terminal, and a gate terminal for receiving a control signal from the cell controller, and controlling a current flowing in a second direction to the corresponding cell.

The first protection circuits of the battery pack may further include: a first resistor connected to a second electrode of the corresponding cell, and transmitting a voltage at the second electrode of the corresponding cell to the cell controller; a capacitor connected between the first resistor and the first electrode of the corresponding cell; and a second resistor connected to the source terminal of the second N-channel field-effect transistor, and operating as a current limiting resistor with the first resistor.

Regarding an overvoltage or a low voltage of the cells, the battery controller may perform a protection operation before the cell controller does.

Advantageous Effects

The battery protection circuit according to the exemplary embodiments may secure safety of respective cells from dangers such as overcharging or short-circuit.

Further, the battery protection circuit according to the exemplary embodiment provides an easy mounting process and needs no additional subsidiary materials in comparison to the case of mounting a TCO, thereby reducing the cost of the battery pack.

MODE FOR INVENTION

Figure 1:
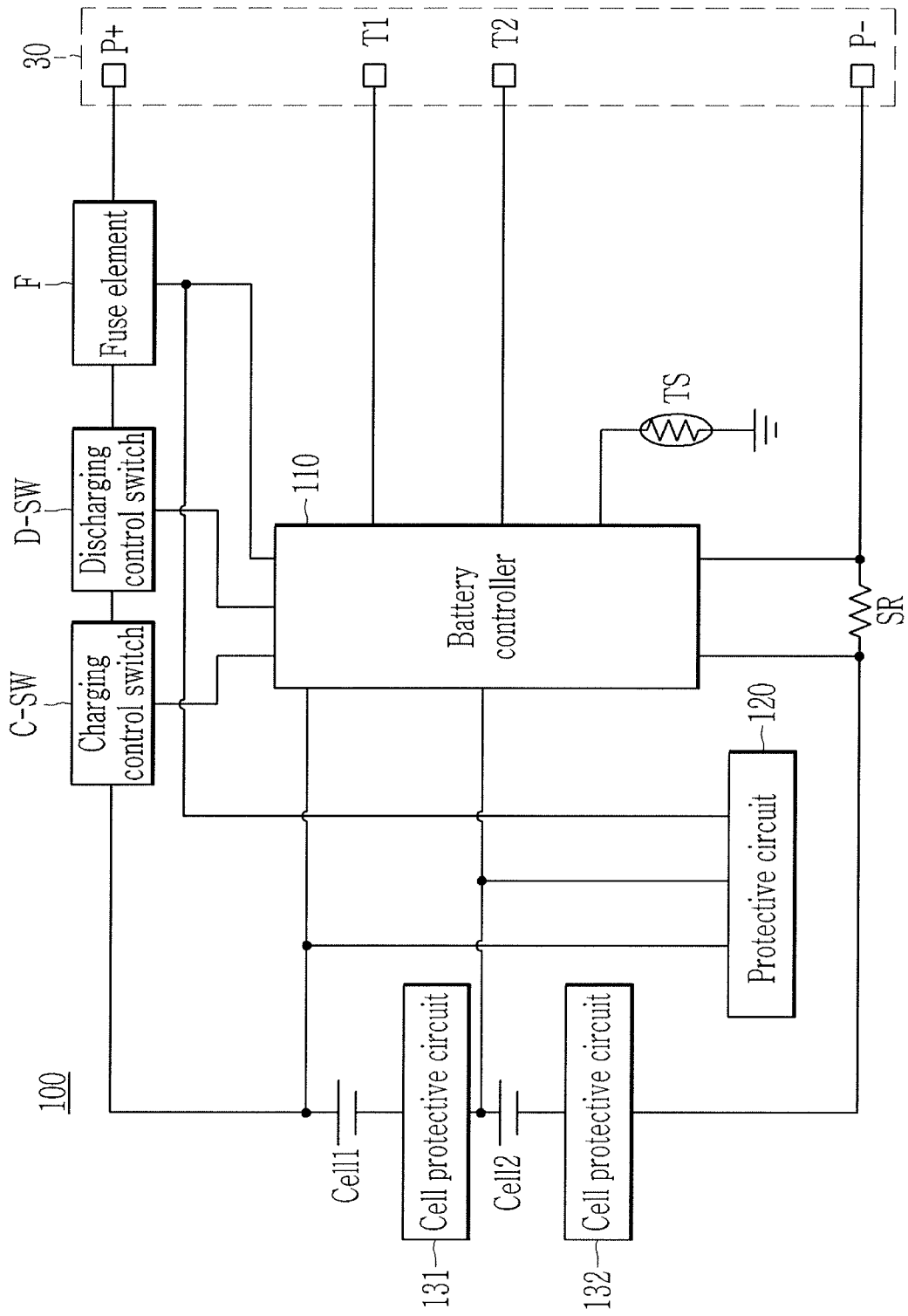
FIG. 1 shows a battery pack according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification. Therefore, the reference numerals of the constituent elements used in the previous drawings may be used for next drawings.

The size and thickness of each configuration shown in the drawings are arbitrarily shown for better understanding and ease of description, and the present invention is not limited thereto. In the drawings, the thickness and areas of layers, films, panels, regions, etc., are exaggerated for clarity.

Electrically connecting two constituent elements includes directly connecting two constituent elements and connecting the same with another constituent element therebetween. The other constituent element may include a switch, a resistor, and a capacitor. When the exemplary embodiments are described, an expression of connection signifies electrical connection when an expressed of direct connection is not provided.

A battery protection circuit according to an exemplary embodiment and a battery pack including the same will now be described with reference to accompanying drawings.

Figure 2:
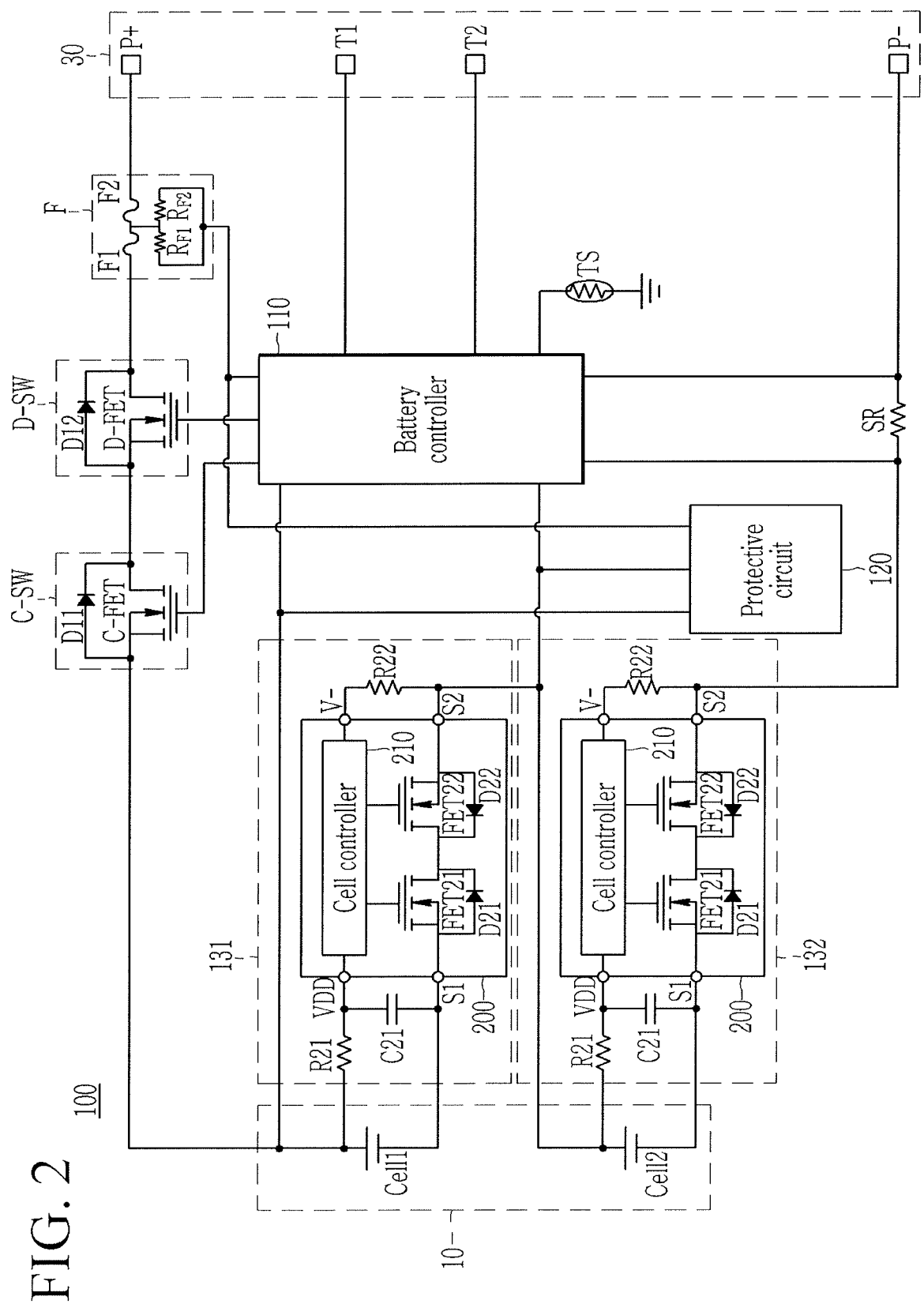
FIG. 2 shows a detailed cell protection circuit of a battery pack shown in FIG. 1.
Figure 3:
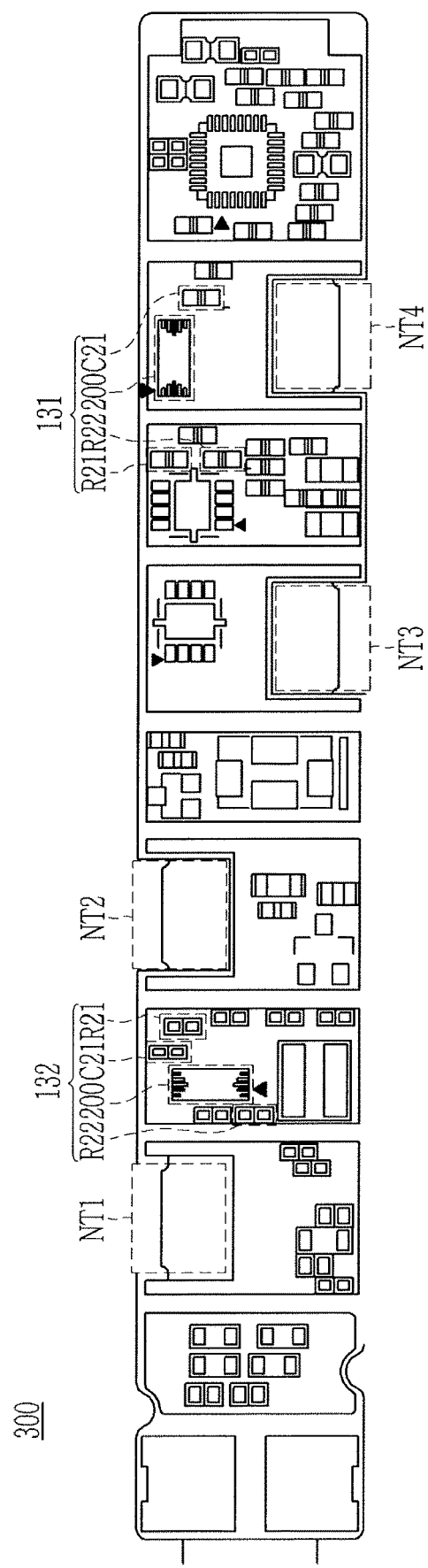
FIG. 3 shows and example of a protection circuit module PCB to which a cell protection circuit according to an exemplary embodiment is mounted.

FIG. 1 shows a battery pack according to an exemplary embodiment and FIG. 2 shows a detailed cell protection circuit of a battery pack shown in FIG. 1. FIG. 3 shows and example of a printed circuit board to which a cell protection circuit according to an exemplary embodiment is mounted.

Referring to FIG. 1 and FIG. 2, the battery pack 100 may include a battery module 10, an interface 30, and a battery protection circuit. The constituent elements shown in FIG. 1 and FIG. 2 are not always needed, so the battery pack according to an exemplary embodiment may be implemented to include a greater or less number of constituent elements.

The battery module 10 may include a plurality of cells (Cell1 and Cell2) connected to each other in series. FIG. 1 and FIG. 2 exemplify that the battery module 10 includes two cells, which is for ease of description and the present invention is not limited to. According to another exemplary embodiment, the battery module may include at least three cells connected to each other in series.

The interface 30 may include a plurality of terminals for performing an interface operation with external devices. The interface 30 may include pack terminals (P+ and P−) for supplying electrical energy to an external load or receiving electrical energy from an external charging device, and communication terminals T1 and T2 for communicating with external devices.

The battery protection circuit may include a charging control switch (C-SW), a discharging control switch (D-SW), fuse element (F), temperature sensor (TS), shunt resistor (SR), battery controller 110, protection circuit 120 and cell protection circuits 131 and 132.

The charging control switch (C-SW) is coupled in series to a charging path of the battery module 10, and it may intercept or supply a charging current of the battery module 10. The charging path represents a current flowing path between a charging device (not shown) connected through the pack terminals (P+, P−) of the battery pack 100 and the battery module 10, and it transmits the charging current supplied by the charging device to the battery module 10.

The discharging control switch (D-SW) is coupled in series to the discharging path of the battery module 10, and it may intercept or supply a discharging current of the battery module 10. The discharging path represents a current flowing path between a load (not shown) connected through the pack terminals (P+, P−) of the battery pack 100 and the battery module 10, and it transmits the discharging current supplied by the battery module 10 to the load.

The charging path and the discharging path have a relatively big current flowing through the path compared to other current flowing paths in the battery pack 100. The discharging path and the charging path will be referred to as a big current path in the present specification.

The charging control switch (C-SW) and the discharging control switch (D-SW) may respectively include field-effect transistors (FETs) (C-FET and D-FET) and diodes D11 and D12.

The respective FETs (C-FET and D-FET) are coupled in series to the big current path, and they may intercept or allow the current (discharging current or charging current) supplied through the big current path according to a control signal applied to a control terminal from the battery controller 110.

The charging control FET (C-FET) may intercept or allow the flow of the charging current supplied to the battery module through the big current path 10 by an external charging device. When the charging control FET (C-FET) is turned on, first and second terminals of the charging control FET (C-FET) may conduct to thus allow the charging current to flow to the battery module 10 from the charging device through the big current path. On the contrary, when the charging control FET (C-FET) is turned off, the flow of the charging current running on the big current path between the charging device and the battery module 10 may be intercepted.

The discharging control FET (D-FET) may intercept or allow the flow of the discharging current supplied to an external load from the battery module 10 through the big current path. When the discharging control FET (D-FET) is turned on, the first and second terminals of the discharging control FET (D-FET) may conduct so the discharging current may flow to the load from the battery module 10 through the big current path. On the contrary, when the discharging control FET (D-FET) is turned off, the flow of the discharging current running through the big current path between the battery module 10 and the load may be intercepted.

For example with reference to FIG. 2, the FETs (D-FET and C-FET) are configured with N-channel FETs. In this case, the first terminal, the second terminal, and the control terminal of each of the FETs (C-FET and D-FET) become a source terminal, a drain terminal, and a gate terminal. Also, the drain terminal of the charging control FET (C-FET) is connected to the drain terminal of the discharging control FET (D-FET), and the source terminals of the charging control FET (C-FET) and the discharging control FET (D-FET) are connected to the battery module 10 and the pack terminal (P+).

FIG. 1 and FIG. 2 exemplify that the charging control switch (C-SW) and the discharging control switch (D-SW) are connected between a positive electrode of the battery module 10 and a positive pack terminal (P+) of the battery pack 100, and the present invention is not limited thereto. According to another exemplary embodiment, the charging control switch (C-SW) or the discharging control switch (D-SW) may be connected between a negative electrode of the battery module 10 and a negative electrode pack terminal (P-) of the battery pack 100.

The diodes D11 and D12 are parasitic diodes of the FETs (C-FET and D-FET), and they are configured so that a current may flow in a direction that is opposite to the direction in which the current is controlled by the corresponding FET. For example, the diode D11 allows the current to flow through the discharging path, and the diode D12 allows the current to flow through the charging path.

The fuse element (F) is connected in series to the big current path, and it may intercept the big current path of the battery module 10.

For example with reference to FIG. 2, the fuse element (F) is a self control protection (SCP) element, and it may include a pair of fuses F1 and F2 connected in series to the big current path of the battery module 10, and heating resistors $R_{F1}$ and $R_{F2}$ connected in parallel to the fuses F1 and F2.

A pair of fuses F1 and F2 configuring the fuse element (F) are coupled in series between the positive electrode of the battery module 10 and the positive pack terminal (P+). The heating resistors $R_{F1}$ and $R_{F2}$ are connected in parallel between a node provided between the first fuse F1 and the second fuse F2 and a control terminal of the fuse element (F). The heating resistors $R_{F1}$ and $R_{F2}$ generate heat according to a voltage applied to the control terminal of the fuse element (F), and the fuses F1 and F2 may be melted by the heating of the heating resistors $R_{F1}$ and $R_{F2}$ and may intercept the big current path of the battery module 10.

The temperature sensor (TS) detects a temperature around the battery module 10 and transmits the same to the battery controller 110.

The shunt resistor (SR) represents a current sensing resistor, and it may be connected in series to the big current path and may be used to measure a current (charging current or discharging current) flowing through the big current path.

For example with reference to FIG. 1 and FIG. 2, the shunt resistor (SR) may be connected between a negative electrode of the battery module 10 and a negative electrode pack terminal (P-). However, the present invention is not limited thereto, and according to another exemplary embodiment, the shunt resistor (SR) may be connected to the big current path between the positive electrode of the battery module 10 and the positive pack terminal (Pack+).

The battery controller 110 may control a general operation of the battery protection circuit.

The battery controller 110 may include a voltage detecting circuit (not shown) connected to the cells (Cell1 and Cell2) configuring the battery module 10 through voltage measuring terminals. The voltage detecting circuit may detect cell voltages of the respective cells (Cell1 and Cell2) configuring the battery module 10, and a voltage at respective ends of the battery module 10.

The battery controller 110 may include a current detecting circuit (not shown) electrically connected to respective ends of the shunt resistor (SR) through current measuring terminals. The current detecting circuit may measure the current flowing to the shunt resistor (SR). The shunt resistor (SR) is provided on the big current path between the battery module 10 and one of the pack terminals (Pack-), so the current detecting circuit may measure the current (charging current or discharging current) flowing through the big current path by measuring the current flowing to the shunt resistor (SR).

The battery controller 110 may detect a temperature around the battery module 10 through the temperature sensor (TS).

The battery controller 110 may obtain states of charge (SOC) of the respective cells (Cell1 and Cell2) configuring the battery module 10 or the battery module 10 based on the cell voltages of the cells (Cell1 and Cell2), a module voltage of the battery module 10, a size of the current flowing to the big current path, and the temperature around the battery module 10. Further, the battery controller 110 may control turning on/off of the charging control switch (C-SW) or the discharging control switch (D-SW) by outputting a control signal to the charging control switch (C-SW) or the discharging control switch (D-SW) based on the battery module 10 or the states of charge (SOC) of the respective cells (Cell1 and Cell2) of the battery module 10.

The battery controller 110 may control the charging control switch (C-SW), the discharging control switch (D-SW), or the fuse element (F) to perform a protection operation for protecting the battery module 10 from an overvoltage, an overcurrent, or a short-circuit.

For example, the battery controller 110 compares the cell voltages detected through the voltage detecting circuit to a first reference voltage for determining an overvoltage caused by an overcharging and a second reference voltage for determining low voltage caused by an over-discharging. When the present battery module 10 is determined to be in an overvoltage state according to a result of comparison, the battery controller 110 may turn off the charging control switch (C-SW) or, the charging control switch (C-SW) and the discharging control switch (D-SW). Further, the battery controller 110 may control the fuse element (F) to intercept the big current path when the battery module 10 is determined to be in the overvoltage state. When the battery module 10 is determined to be in the low voltage state according to the result of comparison, the battery controller 110 may turn off the discharging control switch (D-SW) or, the charging control switch (C-SW) and the discharging control switch (D-SW).

In addition, for example, the battery controller 110 detects the overcurrent (overcharge current or over-discharging current) state of the battery module 10 based on the current flowing to the big current path, and when the battery module 10 is in the overcurrent state, it may turn off the charging control switch (C-SW), or it may turn off the charging control switch (C-SW) and the discharging control switch (D-SW). The battery controller 110 may also intercept the big current path by controlling the fuse element (F) when the battery module 10 is determined to be in the overcurrent state.

In addition, for example, the battery controller 110 may detect a defect of a short-circuit in the battery pack 100 based on the current flowing to the big current path or the temperature around the battery module 10, and when the defect is detected, it may control the fuse element (F) to intercept the big current path.

The battery controller 110 may control an operation of a cell balancing circuit (not shown) for performing a cell balancing of the battery module 10 based on the cell voltages of the respective cells (Cell1 and Cell2).

The battery controller 110 may be connected to an external device through the communication terminals T1 and T2 of the battery pack 100 to communicate with the external device.

Respective functions of the battery controller 110 may be performed by a processor realized with at least one central processing unit (CPU), a chipset, a microcontroller unit (MCU), or a microprocessor.

The protection circuit 120 includes a voltage detecting circuit (not shown) connected to the respective cells (Cell1 and Cell2) configuring the battery module 10, and it may detect the cell voltages of the cells (Cell1 and Cell2) through the voltage detecting circuit.

The protection circuit 120 detects the overvoltage state of the respective cells (Cell1 and Cell2) based on the cell voltages of the respective cells (Cell1 and Cell2), and when a specific cell enters the overvoltage state, it may control the fuse element (F) to intercept the big current path.

The cell protection circuits 131 and 132 may detect the overvoltage, short-circuit, and overcurrent (overcharge current or over-discharging current) state of the respective cells (Cell1 and Cell2) based on the cell voltages of the respective cells (Cell1 and Cell2), and it may perform a protection operation based on the result of detection. That is, the respective cell protection circuits 131 and 132 may, when the corresponding cell is in the overvoltage, overcurrent or short-circuit state, intercept the flow of current between the cells 131 and 132 by opening the big current path, through which the current flows, between the cells 131 and 132.

The respective cell protection circuits 131 and 132 may be coupled in series between the cells or between the cell and the pack terminal on the big current path. For example with reference to FIG. 2, the respective cell protection circuits 131 and 132 are coupled in series between the cell (Cell1) and the cell (Cell2) and between the cell (Cell2) and the pack terminal (P−).

FIG. 2 exemplifies that the respective cell protection circuits 131 and 132 are connected to the negative electrode of the corresponding cell, the present invention is not limited thereto, and the cell protection circuit may be connected to the positive electrode of the corresponding cell. In this case, the cell protection circuit 131 may be connected between the positive electrode of the corresponding cell (Cell1) and the positive pack terminal (P+), and the cell protection circuit 132 may be connected between the positive electrode of the corresponding cell (Cell2) and the negative electrode of the neighboring cell (Cell1). When the respective cell protection circuits 131 and 132 are connected to the positive electrode of the corresponding cell, the battery protection circuit may further include a voltage amplifying circuit so as to control the switching elements (FET21 and FET22) in the cell protection circuits 131 and 132.

The respective cell protection circuits 131 and 132 may include a plurality of FETs (FET21 and FET22) with a common drain structure, a cell controller 210, a plurality of resistors R21 and R22, and a capacitor C21.

The respective FETs (FET21 and FET22) are coupled in series to the corresponding cell on the big current path, and they may allow or intercept the flow of the current (charging current or discharging current) flowing to the big current path.

The first FET (FET21) represents a discharging control switch of the corresponding cell, and it may intercept or allow the flow of the discharging current supplied to an external load through the big current path. When the first FET (FET21) is turned on, the first and second terminals of the first FET (FET21) may conduct so the discharging current may flow to the load through the big current path. When the first FET (FET21) is turned off, the flow of the discharging current running on the big current path may be intercepted.

The second FET (FET22) may intercept or allow the flow of the charging current supplied by an external charging device through the big current path by use of a charging control switch of the corresponding cell. When the second FET (FET22) is turned on, the first and second terminals of the second FET (FET22) conduct so the charging current supplied by the charging device may flow through the big current path. When the second FET (FET22) is turned off, the flow of the charging current running on the big current path may be intercepted.

For example with reference to FIG. 2, the respective FETs (FET21 and FET22) are configured with N-channel FETs. In this case, a first terminal, a second terminal, and a control terminal of each of the FETs (FET21 and FET22) become a source terminal, a drain terminal, and a gate terminal. Further, drain terminals of the first and second FETs (FET21 and FET22) are connected to each other, and source terminals of the first and second FETs (FET21 and FET22) are connected to the negative electrode of the corresponding cell and the positive electrode (or negative electrode pack terminal (P−)) of the neighboring cell, respectively.

The cell controller 210 is connected to respective ends of the corresponding cell to detect the cell voltage of the corresponding cell. Further, the cell controller 210 detects the overvoltage, short-circuit, and overcurrent (overcharge current or over-discharging current) state of the corresponding cell based on the cell voltage of the corresponding cell, and controls turning on/off of the first and second FETs (FET21 and FET22) based on the detection.

For example, the cell controller 210 may, when the voltage at the corresponding cell is equal to or greater than a predetermined overvoltage, turn off the second FET (FET22) that is a charging control FET to intercept the flow of the charging current. In this case, the second FET (FET22) may, when the voltage at the corresponding cell becomes less than the overvoltage, be turned on to allow the flow of the charging current of the corresponding cell. Here, the reference voltage (overvoltage) for the cell controller 210 to determine the overvoltage state of the corresponding cell may be set to be greater than a first reference voltage for the battery controller 110 to determine overvoltages of a plurality of cells. The battery controller 110 may then perform the protection operation for the overvoltage before the cell controller 210 may do.

Further, the cell controller 210 may, when the voltage of the corresponding cell is equal to or less than a predetermined low voltage, turn off the first FET (FET21) that is a discharging control FET to intercept the flow of the discharging current. In this case, the first FET (FET21) may, when the voltage of the corresponding cell becomes greater than the low voltage, be turned on to allow the flow of the discharging current of the corresponding cell. Here, the reference voltage (low voltage) for the cell controller 210 to determine the low voltage state of the corresponding cell may be set to be less than a second reference voltage for the battery controller 110 to determine low voltages of a plurality of cells. The battery controller 110 may then perform the protection operation for the low voltage before the cell controller 210 may do.

The first and second FETs (FET21 and FET22) and the cell controller 210 may be realized into a single integrated circuit (IC) 200. For ease of description, the IC configured with the first and second FETs (FET21 and FET22) and the cell controller 210 will be referred to as a protection IC.

The protection IC 200 may include a VDD terminal connected to the positive electrode of the corresponding cell, a V− terminal for sensing a charging and discharging state of the corresponding cell, an S1 terminal for connecting the negative electrode of the corresponding cell and the source terminal of the first FET (FET21), and an S2 terminal for connecting the positive electrode of the neighboring cell and the source terminal of the second FET (FET22).

The first resistor R21 includes a first terminal connected to the positive electrode of the corresponding cell and a second terminal connected to the VDD terminal of the corresponding protection IC 200, and it may transmit the voltage at the positive electrode of the corresponding cell to the cell controller 210 in the protection IC 200 through the VDD terminal.

The capacitor C21 is connected between the VDD terminal (or the second terminal of the first resistor R21) of the protection IC 200 and the S1 terminal of the protection IC 200, and it may stabilize the voltage (the voltage at the respective ends of the corresponding cell) input to the protection IC 200 together with the first resistor R21.

The second resistor R22 is connected between the S2 terminal (the source terminal of the second FET (FET22)) of the protection IC 200 and the V− terminal of the protection IC 200, and it may work as a current limiting resistor together with the first resistor R21 when a high-voltage charging device exceeding an absolute maximum rate of the protection IC 200 is reversely connected.

The cell protection circuits 131 and 132 may, as shown in FIG. 3, be mounted on a printed circuit board (PCB) 300 on which a battery protection circuit is provided.

FIG. 3 shows an example of the PCB 300 on which a battery protection circuit is provided, exemplifying the state in which some constituent elements (e.g., protection circuit 120) of the battery protection circuit 120 are omitted. Referring to FIG. 3, the PCB 300 includes a plurality of conductive tabs (NT1-NT4), and the respective conductive tabs (NT1-NT4) are combined to the positive electrode or the negative electrode of the corresponding cell. Further, cell protection circuits 131 and 132 including a protection IC 200, first and second resistors R21 and R22, and a capacitor C21 are mounted on the PCB 300.

As described, differing from the TCO, the cell protection circuits 131 and 132 may be mounted on the printed circuit board 300, and they need not be disposed to contact the respective cells. Therefore, the assembling complexity and the cost of the battery pack 100 may be reduced, compared to the conventional battery pack using a TCO to perform a protection operation for each cell.

In addition, compared to the conventional battery pack using a TCO, the influence caused by the surrounding temperature is reduced, thereby improving the accuracy of the cell protection operation.

The battery controller 110, the protection circuit 120, and the cell controller 210 of the protection IC 200 may support their protection functions. That is, one of the battery controller 110, the protection circuit 120, and the cell controller 210 of the protection IC 200 malfunctions to fail to perform the battery protection function, the rest thereof perform the battery protection function to secure the safety of the battery pack 100. For this purpose, the battery controller 110, the protection circuit 120, and the cell controller 210 of the protection IC 200 are independently driven.

The accompanying drawings and the exemplary embodiments of the present invention are only examples of the present invention, and are used to describe the present invention but do not limit the scope of the present invention as defined by the following claims. Thus, it will be understood by those of ordinary skill in the art that various modifications and equivalent embodiments may be made. Therefore, the technical scope of the present invention may be defined by the technical idea of the following claims.

DESCRIPTION OF SYMBOLS

10: battery module
30: interface
100: battery pack
110: battery controller
120: protection circuit
131, 132: cell protection circuit
300: printed circuit board
310: cell controller
400: PCB
C-SW: charging control switch
D-SW: discharging control switch
F: fuse element
TS: temperature sensor FET21: first FET
FET22: second FET
R21: first resistor
R22: second resistor
C21: capacitor
D21, D22: parasitic diode

The invention claimed is:

1. A battery protection circuit configured to control a battery module that includes a plurality of cells connected in series by a high current path, the battery protection circuit comprising:
a charging control switch connected in series to the high current path and disposed between the battery module and a plurality of pack terminals;
a battery controller for controlling the charging control switch based on cell voltages of the plurality of cells; and
a plurality of first protection circuits connected to respective cells on the high current path, such that the plurality of cells alternate with the plurality of first protection circuits on the high current path, and the respective cells are not connected directly together, wherein:
the plurality of first protection circuits are configured for selectively interrupting or allowing a current flowing in the high current path to a corresponding cell based on the cell voltage of the corresponding cell from among the plurality of cells,
the plurality of first protection circuits respectively include:
at least one switch connected in series between neighboring cells of the plurality of cells, and
a cell controller for controlling the at least one switch according to a cell voltage of the corresponding cell,
the plurality of first protection circuits are configured to selectively interrupt current flow between any one of the plurality of cells and the high current path using the at least one switch,
when the at least one switch connected between the neighboring cells is turned on, the neighboring cells are electrically connected to each other in series through the at least one switch connected between the neighboring cells, and
when the at least one switch connected between the neighboring cells is turned off, electrical connection between the neighboring cells is blocked by the at least one switch connected between the neighboring cells.

2. The battery protection circuit of claim 1, further comprising:
a fuse element connected in series to the high current path; and
a second protection circuit for controlling the fuse element based on the cell voltages of the plurality of cells.

3. The battery protection circuit of claim 2, wherein the fuse element includes:
a control terminal;
at least one heating resistor connected to the control terminal and generating heat according to a voltage applied to the control terminal; and
a fuse connected in series to the high current path and configured to be opened by the generation of heat by the heating resistor.

4. The battery protection circuit of claim 2, wherein
The first and second protection circuits are independently driven.

5. The battery protection circuit of claim 1, wherein the at least one switch is a field-effect transistor.

6. The battery protection circuit of claim 5, wherein
the at least one switch includes a first N-channel field-effect transistor including a drain terminal, a source terminal connected to a first electrode of the corresponding cell, and a gate terminal for receiving a control signal from the cell controller, controlling a current flowing in a first direction to the corresponding cell.

7. The battery protection circuit of claim 6, wherein
the at least one switch includes a second N-channel field-effect transistor including a drain terminal connected to the drain terminal of the first N-channel field-effect transistor, a source terminal connected to a cell neighboring the corresponding cell or the first pack terminal, and a gate terminal for receiving the control signal from the cell controller, and controlling a current flowing in a second direction to the corresponding cell.

8. The battery protection circuit of claim 7, wherein
the plurality of first protection circuits respectively include:
a first resistor connected to a second electrode of the corresponding cell, and transmitting a voltage at a second electrode of the corresponding cell to the cell controller;
a capacitor connected between the first resistor and a first electrode of the corresponding cell; and
a second resistor connected to a source terminal of the second N-channel field-effect transistor, and operable as a current limiting resistor with the first resistor.

9. The battery protection circuit of claim 6, wherein
the first electrode of the corresponding cell is a negative electrode of the corresponding cell.

10. The battery protection circuit of claim 1, wherein
regarding an overvoltage or a low voltage of the plurality of cells, the battery controller starts a protection operation before the cell controller does.

11. The battery protection circuit of claim 1, wherein:
the plurality of cells includes a first cell and a second cell,
each of the first cell and the second cell has a first terminal and a second terminal, the first and second terminals of each cell having opposite polarities,
the plurality of first protection circuits includes a first first protection circuit and a second first protection circuit, and,
the first terminal of the second cell is connected to the second terminal of the first cell only by the first first protection circuit.

12. A battery pack, comprising:
a battery module including a plurality of cells, respective ones of the plurality of cells being connected in series by a high current path that is external to the battery module, the battery module not including direct electrical connections within the battery module between the respective cells;
a plurality of pack terminals;
a charging control switch connected in series to the high current path and disposed between the battery module and a pack terminal of the plurality of pack terminals;
a battery controller for controlling the charging control switch based on cell voltages of the plurality of cells; and
a plurality of first protection circuits connected to the respective cells on the high current path, and configured for selectively interrupting or allowing a current flowing in the high current path to a corresponding cell based on the cell voltage of the corresponding cell from among the plurality of cells, wherein:

the plurality of first protection circuits respectively include:
- at least one switch connected in series between neighboring cells of the plurality of cells, and
- a cell controller for controlling the at least one switch according to a cell voltage of the corresponding cell, the plurality of first protection circuits are configured to selectively interrupt current flow between any one of the plurality of cells and the high current path using the at least one switch, when the at least one switch connected between the neighboring cells is turned on, the neighboring cells are electrically connected to each other in series through the at least one switch connected between the neighboring cells, and when the at least one switch connected between the neighboring cells is turned off, electrical connection between the neighboring cells is blocked by the at least one switch connected between the neighboring cells.

13. The battery pack of claim 12, further comprising:
a fuse element connected in series to the high current path; and
a second protection circuit for controlling the fuse element based on the cell voltages of the plurality of cells.

14. The battery pack of claim 12, wherein
the at least one switch includes:
a first N-channel field-effect transistor including a drain terminal, a source terminal connected to a first electrode of the corresponding cell, and a gate terminal for receiving a control signal from the cell controller, and controlling a current flowing in a first direction to the corresponding cell; and
a second N-channel field-effect transistor including a drain terminal connected to the drain terminal of the first N-channel field-effect transistor, a source terminal connected to a cell neighboring the corresponding cell or the first pack terminal, and a gate terminal for receiving the control signal from the cell controller, and controlling a current flowing in a second direction to the corresponding cell.

15. The battery pack of claim 14, wherein
the plurality of first protection circuits respectively further include:
a first resistor connected to a second electrode of the corresponding cell, and transmitting a voltage at the second electrode of the corresponding cell to the cell controller;
a capacitor connected between the first resistor and the first electrode of the corresponding cell; and
a second resistor connected to the source terminal of the second N-channel field-effect transistor, and operating as a current limiting resistor with the first resistor.

16. The battery pack of claim 12, wherein
regarding an overvoltage or a low voltage of the plurality of cells, the battery controller performs a protection operation before the cell controller does.

* * * * *